United States Patent [19]

Brigati et al.

[11] Patent Number: 5,991,199
[45] Date of Patent: Nov. 23, 1999

[54] DEVICE AND METHOD FOR THE PROGRAMMING OF A MEMORY

[75] Inventors: Alessandro Brigati, Castel San Giovanni, Italy; Jean Devin, Aix en Provence; Bruno Leconte, Rousset, both of France

[73] Assignee: STMicroelectronics S.A., Gentilly, France

[21] Appl. No.: 09/012,938

[22] Filed: Jan. 22, 1998

[30] Foreign Application Priority Data

Jan. 22, 1997 [FR] France .................................. 97 00642

[51] Int. Cl.⁶ .................................................. G11C 11/00
[52] U.S. Cl. ................................. 365/185.12; 365/185.11; 365/185.18
[58] Field of Search .......................... 365/185.11, 185.18, 365/185.28, 185.33, 185.12

[56] References Cited

U.S. PATENT DOCUMENTS

| | | | |
|---|---|---|---|
| 4,860,256 | 8/1989 | Devin et al. | 365/189 |
| 4,947,375 | 8/1990 | Gaultier et al. | 365/200 |
| 4,958,324 | 9/1990 | Devin | 365/201 |
| 4,964,079 | 10/1990 | Devin | 365/168 |
| 5,058,069 | 10/1991 | Gaultier et al. | 365/200 |
| 5,099,451 | 3/1992 | Sourgen et al. | 365/185 |
| 5,293,350 | 3/1994 | Kim et al. | 365/238.5 |
| 5,303,189 | 4/1994 | Devin et al. | 365/189 |
| 5,363,330 | 11/1994 | Kobayashi et al. | 365/185 |
| 5,436,479 | 7/1995 | Devin | 257/317 |
| 5,537,349 | 7/1996 | Devin | 365/185 |
| 5,561,621 | 10/1996 | Devin et al. | 365/49 |
| 5,579,265 | 11/1996 | Devin | 365/200 |
| 5,622,879 | 4/1997 | Devin | 438/266 |
| 5,652,720 | 7/1997 | Aulas et al. | 365/185 |
| 5,748,528 | 5/1998 | Campardo et al. | 365/185.13 |
| 5,796,657 | 8/1998 | Lee et al. | 365/185.11 |

FOREIGN PATENT DOCUMENTS

| | | |
|---|---|---|
| 0459794A2 | 12/1991 | European Pat. Off. . |
| 0704851A1 | 4/1996 | European Pat. Off. . |
| 08147988 | 6/1996 | Japan . |

OTHER PUBLICATIONS

"A 16–Mb Flash EEPROM with a New Self–Data–Refresh Scheme for a Sector Erase Operation" Atsumi et al, Journal of Solid State Circuits, vol. 29 No. 4, Apr. 1994.

Primary Examiner—Vu A. Le
Attorney, Agent, or Firm—Gunster, Yoakley, Valdes-Fauli & Stewart, P.A.; Stephen Bongini

[57] ABSTRACT

In a device for programming EPROM-Flash type memory cells of memory words of a memory, a bit line of a memory cell of a given rank of the first word and at least one bit line of a memory cell of the same rank in a word that is horizontally adjacent to this first word are connected together to two common programming connections by means of a bias circuit, and the bias circuit comprises two bias voltage inputs and one bias voltage output. The programming method consists in the successive programming, during different programming cycles, of the different cells of this first word and, during the same programming cycle, a different cell, of the same rank, in at least one word that is different from this first word is programmed.

26 Claims, 3 Drawing Sheets

DEVICE AND METHOD FOR THE PROGRAMMING OF A MEMORY

CROSS-REFERENCE TO RELATED APPLICATIONS

This application is based upon and claims the benefit of the priority of the prior French patent application 97 00642 filed on Jan. 22, 1997, the contents of which are incorporated herein.

BACKGROUND OF THE INVENTION

1. Field of the Invention

The present invention relates generally to semiconductor electronics and more specifically to a device and method for the programming of a Flash-EPROM (erasable programmable read-only memories) type memory.

2. Description of Related Art

In Flash-EPROM memories, each information storage element or memory cell consists of a floating-gate MOS (metal oxide semiconductor) transistor that may be in one of two states. Thus, in the case of an N channel MOS transistor, in a first state called an erased state, no negative charge, or even a positive charge, is trapped at the floating gate. A conduction channel can then exist between the source and drain of this transistor. In a second state, called a programmed state, electrons are trapped in the floating gate. The electronics therefore prevent the creation of a conduction channel in the substrate between the source and drain. In this case, the transistor is off and behaves like an open circuit.

In a Flash-EPROM type memory, the passage of an electron from the conduction channel to the floating gate is done by a so-called hot electron method. To this end, high voltages are applied between the control gate and the drain of this same floating-gate transistor while the source is connected to the ground. These voltages enable the passage of very high-energy electrons (hot electrons), coming from the channel thus created, to the floating gate. The electrons are then trapped in the floating gate and constitute an information element. The removal of the charges, or erasure, is prompted by a tunnel effect.

A memory array consists of words comprising, in one example, at least eight cells each capable of containing an information element (namely one of the two previous states). FIG. 1 gives a partial view of an architecture of this kind. These cells may be selected individually. They are arranged in rows and columns.

In a standard architecture, all the floating-gate transistors of the memory cells of one word, or one byte in the example, have their control gates connected to the same voltage source by a word line and their sources connected to the same terminal of a selection transistor. This selection transistor permits or does not permit the biasing of the source of the floating-gate transistors of the word. An architecture of this kind with a selection transistor of this kind is described in the patent application EP-A-0 704 851. The selection transistor prevents the depletion of the floating-gate transistor of a cell and thus provides for perfect uniformity of the threshold voltage of the cells that are the object of an erasure.

This same selection transistor has its other electrode, namely its drain or source electrode, connected to a source vertical connection of words that are vertically adjacent. The vertically adjacent words are therefore on different rows. This selection transistor enables the biasing or non-biasing of the common sources of the floating-gate transistors of one word. These words have Q bytes. If Q=1, the word has one byte. The floating gates of the floating-gate transistors of the cells of the words in one row are connected to the same word line. Furthermore, the control gates of the selection transistors of the words of one row are connected to the same word selection line receiving an associated selection signal that is often identical to the signal applied to the word line.

With an architecture of this kind, there are constraints that limit the programming of several memory cells of one word during a programming cycle. Indeed, during the programming operation, the control gate of each cell of a row is subjected to a high voltage. The drain of the floating-gate transistor of a cell that is selected to be programmed is taken to a high voltage that is high enough to accelerate the charges in a channel. The source of this floating-gate transistor is taken to the ground. This high voltage enables the charges to acquire high energy, and produces a high current through this channel (500 $\mu$A/cell). Thus, for one byte, the current produced during this programming may be in the range of 10 mA. This current is far too high for the vertical connection of the source which is limited in size and thus cannot withstand a current of such strength. For example, if many cells were to be programmed in the same word, the current produced would prompt a liberation of the metal film from the source vertical connection by a phenomenon of electromigration. Furthermore, this current which thereby prompts an elevation of the source current reduces the efficiency of the programming.

Accordingly, a need exists for a device and method for programming of a memory that overcomes this.

SUMMARY OF THE INVENTION

A device for the programming of Flash-EPROM type memory cells of memory words of a memory comprises connections for organizing the memory cells into words and a plurality of floating-gate transistors acting as storage units in the cells. The drain electrodes of each of the floating-gate transistors of the cells of a first word are connected to connections of differentiated bit lines of the first word and the drain electrodes of the floating-gate transistors of each cell of each word vertically adjacent to the first word are connected to the bit line connections of the corresponding cell of the first word. A bit line of a memory cell of a given rank of the first word and of at least one bit line of a memory cell of the same rank in a word horizontally adjacent to this first word are connected together to two common programming connections by means of bias circuits, and each bias circuit comprises two bias voltage inputs and one bias voltage output.

BRIEF DESCRIPTION OF THE DRAWINGS

Other features and advantages of the present invention shall appear from the following description of various embodiments. This description is made hereinafter with reference to the appended drawings, of which.

DETAILED DESCRIPTION OF THE INVENTION

According to the invention, a programming circuit enables the programming of M cells at the same time and, preferably, the parallel programming, during a cycle, of M bits in N different words that are preferably adjacent, where M is smaller than the number of cells of a word and preferably equal to one. Consequently, the current at the source vertical connections that are acted upon is proportional to M. Naturally, it is possible to envisage another distribution: a programming of two or four bits at the same time instead of the single bit that is planned. This approach enables a considerable reduction of the current in each word and therefore enables a smaller drop in voltage. Furthermore, in the invention, at the same time as a cell of one word is programmed, a cell of another word is programmed. The programming of N words of P bits is then done for example in P/M cycles.

Figure 1:
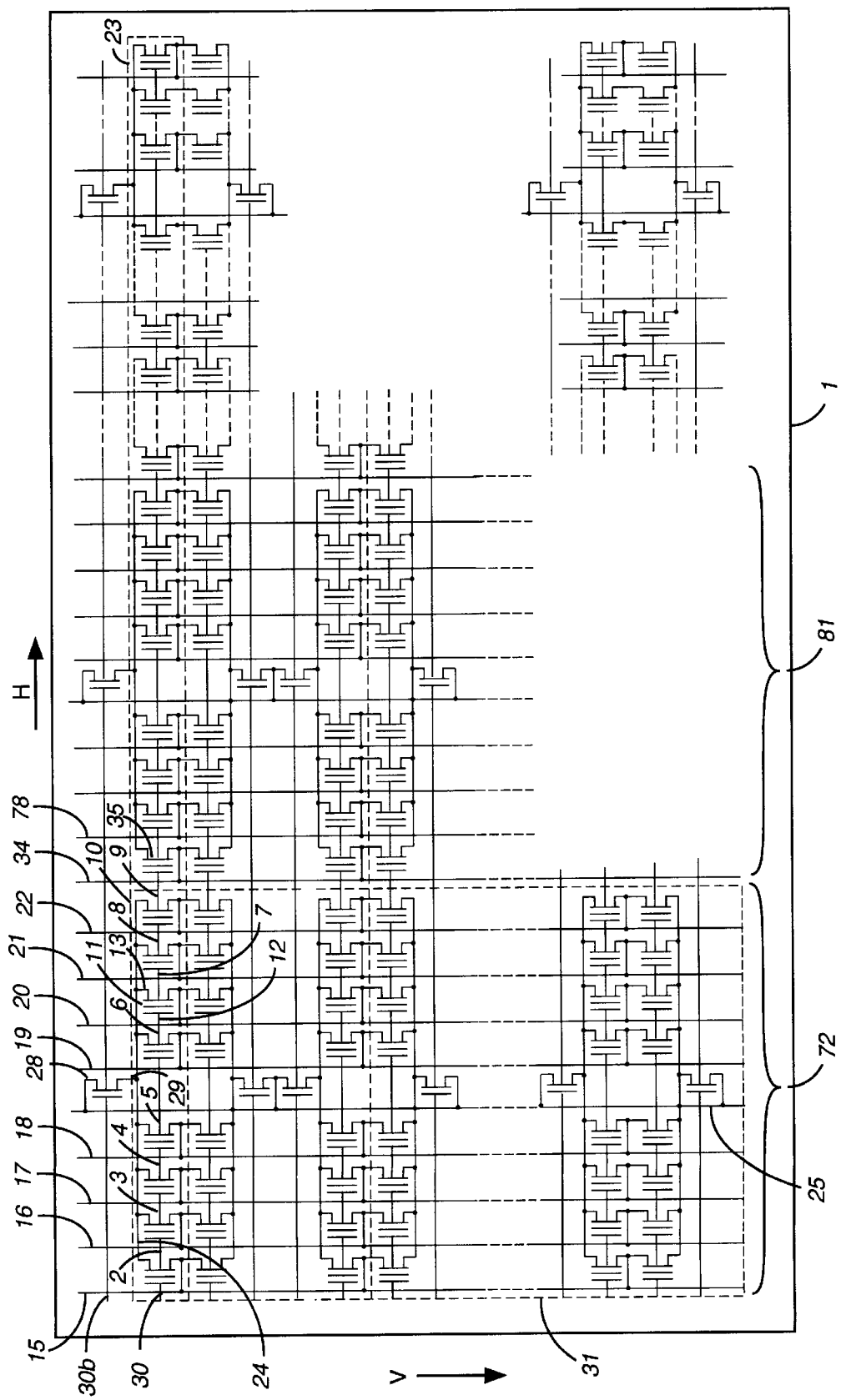
FIG. 1 is a schematic view of the circuit of a prior art Flash-EPROM type memory organized in words of eight cells.

FIG. 1 shows a Flash-EPROM type memory 1 comprising cells 2 to 9 organized in words, such as the first word 10. Each memory cell, for example cell 7, comprises a floating-gate transistor acting as a storage unit in the cells (the cells and the respective floating-gate transistors bear the same reference numbers throughout the description). This transistor 7 has a floating gate 11, a control gate 12 and two main electrodes 13 and 14 respectively. The control gate electrodes 12 of the first word 10 are connected to the same word line 30. The drain electrodes 14 of the transistors 2 to 9 of the cells of the first word 10 are connected to connections of differentiated bit lines 15 to 22 of this word. The other main electrode 13, namely the source electrode of the transistors 2 to 9 of the first word 10, is connected to a source connection 24 of this word. This connection 24 is itself connected to a vertical source connection 25 by means of a selection transistor 26 (shown in FIG. 2). This selection transistor 26 has a control gate 27 and two main electrodes 28 and 29 respectively. The main electrode 28 is connected to the vertical source connection 25. The electrode 29 is connected to the source connection 24 of the word 10. The transistor 26 receives, at its control gate 27, word selection signals conveyed by a connection 30b.

The memory 1 consists of vertical sets 31 of words such as 10 positioned vertically, that are vertically adjacent to this word 10. The vertically adjacent words have a constitution identical to that of the word 10. The drain electrodes of floating-gate transistors of cells of the words vertically adjacent to this first word 10 are connected to the bit lines 15 to 22 of the first word. Two vertically adjacent words are two words located one on top of the other, with no other word between them.

The memory 1 is constituted by a row 23 of words such as 10 that are horizontally adjacent to this first word. The control gate electrodes of floating-gate transistors of cells of the words of the row 23 are connected to the word line connection 30 of this first word 10. Two horizontally adjacent words are two words located side by side, with no other word between them, on the same horizontal line H shown in FIG. 1. All these words positioned vertically and horizontally determine a matrix. During an operation for programming a memory cell, the voltage of the word line 30 and of the connection 30b is made to rise to 12V. Using a bias circuit, in accordance with the invention, a selected bit line, such as any of lines 15 to 22, is taken to a voltage of 6V. The connection 25 is then connected to the ground, thus grounding all the sources of the transistors of the selected word by conduction through the selection transistor 26. This would give rise, during a programming of several cells, to the creation of an excessively high current damaging the connection 25 and limiting the efficiency of the programming.

Figure 2:
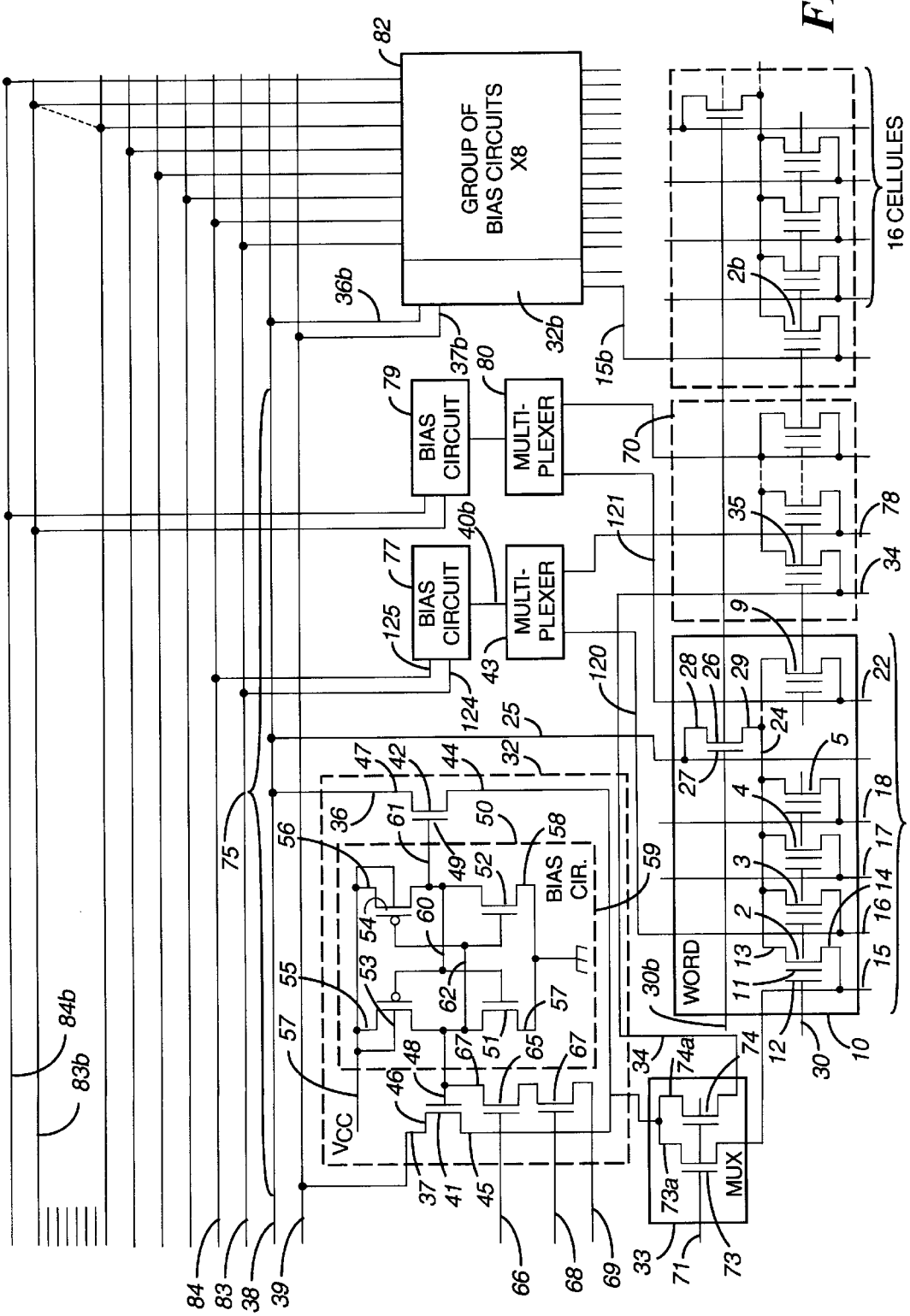
FIG. 2 gives a schematic view of a row of words of the Flash-EPROM memory of FIG. 1 provided with a bias circuit associated with a multiplexer according to the present invention.

A description is now given, with reference to FIG. 2, of an embodiment of the invention. FIG. 2 shows a row of the matrix of the memory 1. A bias circuit 32, associated herein in a particular embodiment with a multiplexer 33, sets up the connection, according to the invention, of bit line 15, to two common programming connections 38, 39 by means of two connection links, respectively 36 and 37. The principle is that a bit line such as 15 of a cell 2, having a given rank in a first word 10, and at least one bit line such as 15b of a memory cell 2b having a same rank in another word that is preferably horizontally adjacent to this first word 10, are connected to the same common programming connections, 38 and 39, by means of different bias circuits 32 and 32b. The circuit 32b is connected to the connections 38, 39 by connections 36b and 37b.

The bias circuit 32 has two bias voltage inputs 36, 37 and one bias voltage output 40 corresponding to a bit line. This output 40 is connected to the input of the multiplexer 33. The multiplexer 33 has two transistors 73, 74, of which one, transistor 73, is a P type transistor, while the other, transistor 74, is an N type transistor. The output 40 is connected, firstly, to a main electrode 75 of the transistor 73 and, secondly, to the main electrode 76 of the transistor 74. The other two main electrodes of these two transistors 73 and 74 are connected respectively to a bit line connection 15 and 34. The working of this optional multiplexer 33 shall be explained further below.

The circuit 32 has two bias transistors 41 and 42 and, in addition, a distribution connection 43 connected to first main electrodes 44 and 45 of these two transistors 41 and 42. The other main electrodes 46 and 47 of these two transistors 41 and 42 are connected respectively to the two connections 37 and 36. Control gate electrodes 48,49 of these transistors 41 and 42 are connected to a circuit 50 for the delivery of data elements to be programmed. This circuit 50 for delivering data elements is a storage circuit used to store a value and a complementary value of a binary data element to be programmed. This storage circuit 50 comprises, in one example, four transistors including two N type transistors, 51 and 52 respectively, and two P type transistors, 53 and 54 respectively, mounted together as a Schmitt trigger. The two transistors 53 and 54 have their main electrodes 55 and 56 connected to line 57 that is itself connected to a supply Vcc. These transistors, 53 and 54 respectively, are series-connected by their other main electrode with the other two transistors, 51 and 52 respectively. The midpoints of the pairs of transistors 51, 53 and 52, 54 are named A and B. The other main electrodes 57 and 58 of the two transistors 51 and 52 are connected to line 59 connected to the ground. The control gate electrodes of the two transistors 53 and 54 are connected respectively to the control gate electrodes of the two transistors 51 and 52. These connections are themselves connected to the two terminals B and A respectively. The terminal B is connected to the control gate electrode 49 of the transistor 42 by the connection 61. Similarly, the terminal A is connected to the control gate electrode 48 of the bias transistor 41 by the connection 63. The two connections 61 and 63 constitute two outputs of the data delivery circuit 50 enabling the transistors 42 and 41 to be controlled in opposition.

To lead the data element into the circuit 50, the node A is set at a requisite potential by a sequence of series-connected transistors 65 and 67. The connection 63 is linked to the main electrode 64 of the transistor 65. The transistor 65 is series-connected by its other main electrode to the transistor 67. The transistor 67 has a control gate 68 and another main electrode 69. The gate 68 controls the passage or non-passage of the data element to be programmed. The transfer of the data elements into the circuits 50 takes place at the time of application of a pace-setting signal to the connection 68. All the connections 68 of the different circuits 32 are connected to each other. The data element to be programmed is applied to the main electrode 69 of the transistor 67. The electrode 66 of the transistor 65 is connected to the output of a bit line decoder. Prior to the programming, the connections 66 and 68 are used to lay down the voltages necessary for the conditioning of all the circuits 50 of the memory. The circuits 50 that are selected receive a high voltage at the connection 66. For those that are selected, the connection 69 is taken to the high voltage or to zero depending on the value of the bit to be programmed.

The circuit 50 delivers the data element to be programmed. The circuit 50 delivers two complementary logic states at its two outputs 61 and 63. The circuit 32 therefore transmits, to its output 40, one of the two voltages admitted at its two inputs 36 and 37. The data element to be programmed in the cell 2 is programmed by the application, to the two common programming connections 38 and 39, of a pair of voltages implying a preparation for programming. In one example, this pair of voltages is equal to 6 volts carried on the connection 38 and 2 volts carried on the connection 39. The circuits 32 which are connected to cells that (for the time being) are not to be programmed receive a pair of voltages implying an inhibition of programming. In one example, this pair of inhibition voltages is equal to 2 volts and 2 volts carried on the other common connections such as 83 and 84. Thus, the inputs of the bias circuits 32, 77, 79 or 32b are connected to pairs of common connections 38 and 39 or 83 and 84, etc.

In one example, there are eight pairs of common connections such as 38, 39. The two inputs of the circuit 32 are connected to the first pair of common connections 38, 39; the two inputs of the circuit 77 are connected to the second pair of common connections 83 and 84. The two inputs of an eighth bias circuit 79 are connected to the eighth pair of common connections 83b, 84b. These eight circuits belong to a first group 75 of bias circuits.

Another group 82 of eight bias circuits is connected, under the same conditions, to the connections 38, 39, 83, 84 up to 83b, 84b. Each bias circuit having the same rank, in the group 82, as a bias circuit of the group 75 has its two inputs such as 36 and 37 connected to a pair of common connections having the same rank. A single pair of common connections is taken to the programming voltages (6 volts, 2 volts). All the others are taken to the pair of inhibition voltages (2V, 2V). There are as many groups (N) connected at the same time to the same common connections 38, 39 as there are cells to be programmed at the same time. In one example, N equals 8.

To program all the cells of a word 10, the common connections 38 and 39 respectively and then 83, 84, 83b, 84b respectively are taken to 6V, 2V, all the other connections being at 2V, 2V. And so on and so forth up to 83b, 84b. An eight-bit word is programmed in eight cycles.

With the invention, in a particular embodiment, it is desired that the memory array of the Flash-EPROM type memory when finished should comprise a number of bit lines that is twice the number of bit lines of a standard EEPROM memory (1024 bit lines on a word line instead of 512 bit lines). In a standard EEPROM memory, there is a number of bias circuits equal to the number of bit lines. In the present case, the number of bit lines is twice this number. Furthermore, specifications relating to EEPROM memories lay down that no more than 64 bit lines should be programmed at a time. In the invention there is then provided a multiplexing circuit capable of successively controlling two same-ranking bit lines corresponding to two words that are horizontally adjacent in an interleaved arrangement.

According to a specific embodiment, the bit line 15 of a memory cell (of a given rank) of the word 10 is twinned with a bit line 34 of a memory cell (of the same rank) of a word 70 that is directly adjacent horizontally to this first word 10. The twinning is done by the multiplexing circuit 33. The circuit 33 routes the output 40 of the circuit 32 to either of these bit lines 15 or 34 as a function of a command applied on a connection 71. The command permits the transmission of the programming (or inhibition) potential to only one of these two bit lines at a time. In other words, either the bit line 15 or the bit line 34 is programmed and, hence, either the cell 2 or the cell 35 belonging to the word 70 is programmed.

The memory array of the memory 1 is thus organized in two distinct interleaved pages. A first page comprises the words 10 and a second page comprises the words 70. The two pages thus comprise groups 72 and 81 of vertically adjacent words (FIG. 1). The principle is that all the cells of the word are programmed successively in the first page and then all the cells of a word are programmed successively in the second page. The command applied to the connection 71 is therefore changed once every eight cycles. The reason for the presence of the multiplexer 33 is that the circuits 32 take up much space. Since it is necessary to have eight of them for eight bit lines (to program the cells of a word), it means that the bit lines 15 to 23 have to be spaced out. By introducing the multiplexers 33, it is possible to house twice the number of bit lines, those of the word 10 and those of the word 81, in the total amount of space taken up by the eight bias circuits, 32, 77 and 79 are shown.

An interleaving of words (72, 81) has been described. It is however possible to interleave the cells directly. In this case, the cell 35 would be placed beside the cell 2 (instead of the cell 3). This latter method would have the advantage of reducing the amount of surface area occupied: there would no longer be any horizontal connection 120, 121 passing above the word 10 or the word 70. In practice, the height would be reduced by fourteen thicknesses of these connections 120, 121.

FIG. 2 shows another bias circuit 77 and its associated multiplexer 76, which are identical to the bias circuit 32 and the multiplexer 33. The circuit 77, like the circuit 32, has two bias voltage inputs 124, 125 and one bias voltage output 40b. The circuit 77 enables the bias, as desired, of two bit lines 16 or 78 depending on the value of the command received by the multiplexer 76. The multiplexers are all controlled by the signal transmitted on the connection 71. The bit line 16 is horizontally adjacent to the bit line 15 just as the bit line 78 is horizontally adjacent to the bit line 34. The eighth circuit is shown with the eighth bias circuit 79 of the word 10. Its associated multiplexer 80 enables the biasing, as desired, of cell 9 or, depending on the state of the command applied on the connection 71, the biasing of a cell of the horizontally adjacent word 70. The group 75 of these eight bias circuits enables the biasing of two words (10, 70) of the memory on the same line of the matrix. Similarly, the figure shows another group 82 representing eight bias circuits to which there also correspond two words, these bias circuits working in the same way as the bias circuits comprising group 75, of which are shown 32, 77 and 79 associated with the multiplexers 33, 76 and 80. This group 82 has sixteen outputs representing the outputs of the eight multiplexers and sixteen inputs connected to the eight common programming connections.

Figure 3:
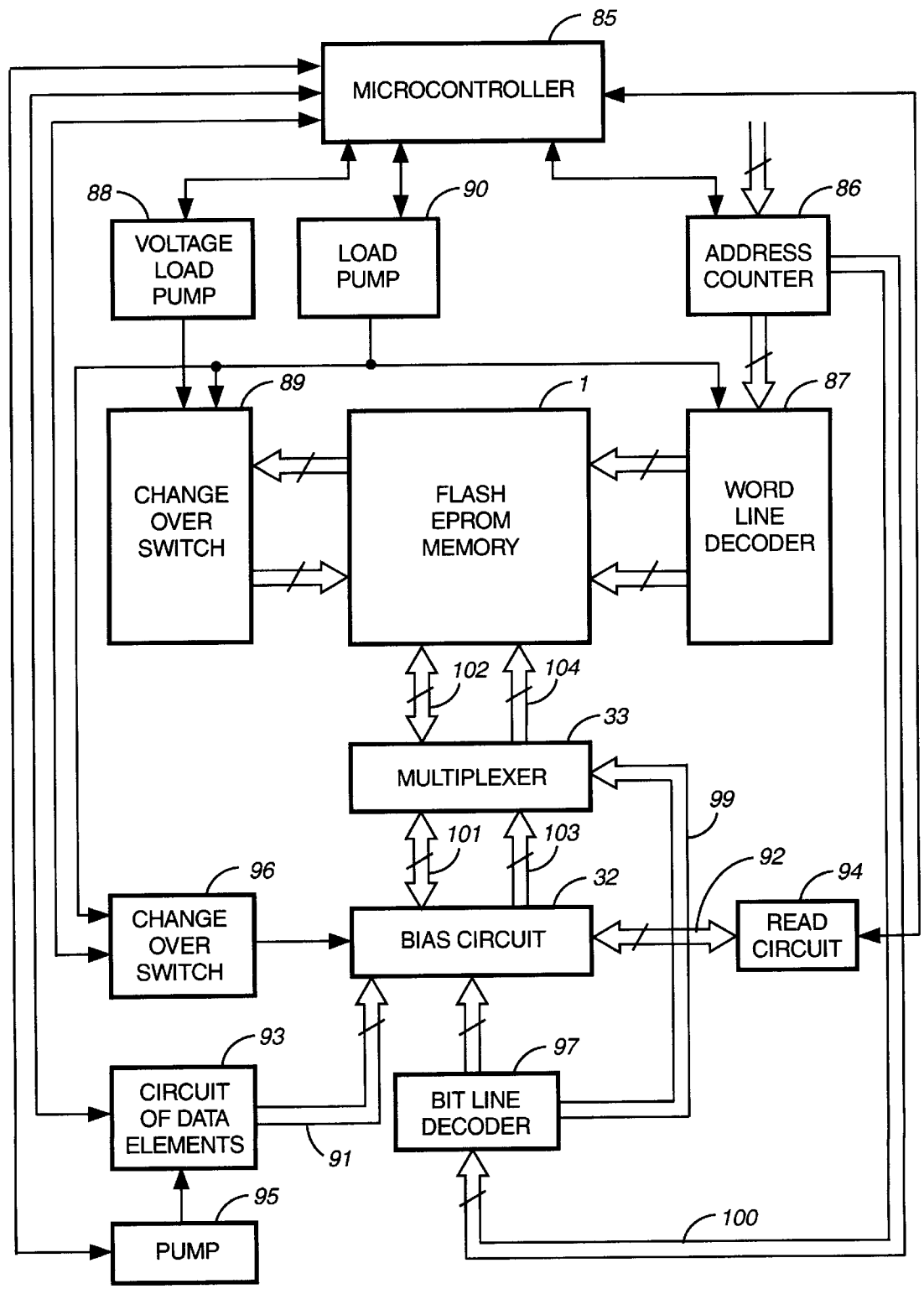
FIG. 3 gives a schematic overall view of the peripheral circuits of the Flash-EPROM memory comprising in particular the bias circuit and its associated multiplexer according to the present invention.

FIG. 3 shows a Flash-EPROM type memory 1 surrounded by its peripherals symbolically comprising a bias circuit 32 associated with a multiplexer 33. The figure shows a microcontroller 85 used to control the operation of an address counter 86. This counter 86 enables the addressing of a row decoder 87. This counter 86 includes 8 inputs and 256 outputs corresponding to the number of word lines existing in the memory 1. A negative voltage load pump 88, controlled by the microcontroller 85, supplies a voltage change-over switch 89 connected to the memory 1. This change-over switch 89 can be used to obtain a negative voltage for erasure as well as a positive voltage for programming on word lines selected by the decoder 87.

A load pump 90, controlled by the microcontroller 85, enables the supply of the word line decoder 87, the voltage change-over switch 89 and a source line change-over switch 96. A bit line decoder 97 and the word line decoder 87 enable the application, to the connections of the memory 1, of the potentials representing information elements to be recorded in the memory cells or representing commands for the writing or reading of information in the cells. The bias circuit 32 is furthermore connected to a circuit 93 of data elements to be programmed, controlled by the microcontroller 85. The circuit 93 gives the data elements to be programmed to the delivery circuits 50. The circuit 32 has data buses at its inputs and outputs to convey data elements read and to be written. These are the buses 92 and 91 respectively. The bus 92 is connected to a read circuit 94 controlled by the microcontroller 85. The circuit 93 and the circuit 94 enable the biasing of the two inputs, 38 and 39 respectively, of the bias circuit 32, in write mode (programming or erasure) as well as in read mode. For practical reasons, the circuit 93 is connected to a drain load pump 95 controlled by the microcontroller 85. The pump 95 enables the supply of a high current of about 4 mA (one cell consumes a current of about 500 µA) at the common connection 38. The circuit 95, 93, 91 enables the biasing of the second input 39 of the bias circuit 32.

The circuit 32 is connected to a control bus 99 coming from the bit line decoder 97 and delivering a signal corresponding to either of the two pages to be programmed. The input of this decoder 97 of bit lines is also connected to the address counter 86 by an address bus 100. The output of the bias circuit 32 comprises a data bus 101 with a number of connections corresponding to the total number of bias circuits 32 enabling the programming of the entire memory, namely 512 bias circuits. In the example, this memory 1 has 1024 bit lines.

Finally, the multiplexer (33) is connected to the memory 1 by an address bus 102 for which the number of wires corresponds to the number of bit lines existing in the memory 1. Two buses 103 and 104 enable the selection of the source lines by the dispatch of control signals to the transistors 26.

A novel aspect of the invention lies especially in the presence of the microcontroller 85 and in the circuits 32, 33, 89, 93, 95 and 96. The microcontroller 85 performs a program for the programming of the cells of the same word, one after the other, during successive and different programming cycles.

The programming of the memory array of the memory 1 is achieved by a sequence of operations.

During a first operation, the cells such as 2 to 9 of a first page are selected by means of the command applied on the connection 71 of the multiplexing circuit 33.

Then, preferably, during a second operation, all the cells 2 to 9 of the same page are programmed at the same level making it possible to obtain a uniform threshold voltage for each cell of the selected page. During a third operation, all the selected cells 2 to 9 are erased. During the erasure, the bias voltage applied to the control gate electrode of a word 10 is in the range of −6V. All the cells of the same word line such as 30 receive this voltage whether or not the page is selected. Furthermore, the source electrode is taken to a voltage of about 10V. The drain electrode is taken to a state of high impedance. The erasure requires a series of several very brief pulses of about 100 µs. These voltages, during erasure, may prompt firstly a depletion in the cells such as 2 to 9 of the selected page. The cells such as 35 of a non-selected page furthermore receive this same voltage of −6V at their control gate electrode. This negative voltage causes losses of charges at their floating gate and tends to erase them to some extent.

For selected cells such as 2 to 9 of a selected page, it is ascertained before any programming, according to the invention, that the cells have undergone a depletion. If this is the case, these cells are reprogrammed slightly so that they recover a threshold voltage that has become excessively low after erasure. Similarly, a reprogramming or refreshing operation will be done on the non-selected cells such as 35 of a non-selected page that may have undergone a parasitic erasure or a loss of charges during the erasure preceding the programming owing to the high voltage applied to the word line such as 30.

The foregoing is merely illustrative of the principles of the invention. Those skilled in the art will be able to depart from the disclosed embodiment and device alternate embodiments, nevertheless embodying the principles of the claimed invention.

What is claimed is:

1. A device for the programming of Flash-EPROM type memory cells of memory words of a memory comprising:

connection means for organizing the memory cells into words, a plurality of floating-gate transistors acting as units of storage in the cells, the drain electrodes of the floating-gate transistors of the cells of a first word being connected to connections of differentiated bit lines of the first word, and the drain electrodes of the floating-gate transistors of each cell of each word vertically adjacent to the first word being connected to the bit line connections of the corresponding cell of the first word, a plurality of bias circuits wherein each bias circuit comprises two bias voltage inputs and one bias voltage output; and wherein a bit line of a memory cell of a given rank of the first word and of at least one bit line of a memory cell of the same rank in a word horizontally adjacent to this first word are connected together to two common programming connections by means of bias circuits.

2. The device of claim 1, wherein:

the device further comprises a circuit for the delivery of the data element to be programmed; and each bias circuit further comprises:

two bias transistors and, at least one output comprising a distribution connection connected to the first main electrodes of the two bias transistors, the other main electrodes of the two bias transistors being connected respectively to the two common programming connections, and wherein the control gates of the bias transistors are connected to the circuit for the delivery of the data element to be programmed.

3. The device of claim 2, wherein the data delivery circuit comprises:

a storage circuit to store a value and a complementary value of a binary data element to be programmed, the storage circuit comprising two outputs respectively connected to the two control gates of the bias transistors to control them in opposition.

4. The device of claim 1, wherein:

a bit line of memory cells of a given rank in the first word is twinned with a bit line of a memory cell of a same rank in a word that is directly adjacent horizontally to the first word by a multiplexing circuit that routes the output of the bias circuit to either of these lines as a function of a command.

5. The device of claim 2, wherein:

a bit line of memory cells of a given rank in the first word is twinned with a bit line of a memory cell of a same rank in a word that is directly adjacent horizontally to the first word by a multiplexing circuit that routes the output of the bias circuit to either of these lines as a function of a command.

6. The device of claim 3, wherein:

a bit line of memory cells of a given rank in the first word is twinned with a bit line of a memory cell of a same rank in a word that is directly adjacent horizontally to the first word by a multiplexing circuit that routes the output of the bias circuit to either of these lines as a function of a command.

7. The device of claim 1, wherein:

the control gate electrodes of the floating-gate transistors of cells of horizontally adjacent words in a memory array of the memory are each connected to a connection of word lines, drain electrodes of floating-gate transistors of cells of a given rank of vertically adjacent words in a memory array of the memory are connected to the same connection of bit lines, a bit line of a cell of a given rank of the first word being connected to a bit line of a cell of the same rank of the horizontally adjacent word of the memory, both lines being connected to two same common programming connections by means of a bias circuit, the source electrodes of floating-gate transistors of the cells of a word are connected together to a source connection of the word, for words vertically adjacent to the first word, the source connections of the vertically adjacent words are connected to a vertical connection of sources by means of vertical transistors for the selection of these vertically adjacent words, these selection transistors being coupled to receive word selection signals at their control gate, to program a cell of a different word horizontally adjacent to the first word, the control gate of the selection transistor of the horizontally adjacent different word receives the selection signal of the first word.

8. The device of claim 2, wherein:

control gate electrodes of floating-gate transistors of cells of horizontally adjacent words in a memory array of the memory are connected to the same connection of word lines, drain electrodes of floating-gate transistors of cells of a given rank of vertically adjacent words in a memory array of the memory are connected to the same connection of bit lines, a bit line of a cell of a given rank of the first word being connected to a bit line of a cell of the same rank of the horizontally adjacent word of the memory, both lines being connected to two same common programming connections by means of a bias circuit, source electrodes of floating-gate transistors of the cells of a word are connected together to a source connection of the word, for words vertically adjacent to the first word, the source connections of these words are connected to a vertical connection of sources by means of vertical transistors for the selection of these vertically adjacent words, these selection transistors receiving word selection signals at their control gate, to program a cell of a different word horizontally adjacent to the first word, the control gate of the selection transistor of the horizontally adjacent different word receives the selection signal of the first word.

9. The device of claim 3, wherein:

control gate electrodes of floating-gate transistors of cells of horizontally adjacent words in a memory array of the memory are connected to the same connection of word lines, drain electrodes of floating-gate transistors of cells of a given rank of vertically adjacent words in a memory array of the memory are connected to the same connection of bit lines, a bit line of a cell of a given rank of the first word being connected to a bit line of a cell of the same rank of the horizontally adjacent word of the memory, both lines being connected to two same common programming connections by means of a bias circuit, source electrodes of floating-gate transistors of the cells of a word are connected together to a source connection of the word, for words vertically adjacent to the first word, the source connections of these words are connected to a vertical connection of sources by means of vertical transistors for the selection of these vertically adjacent words, these selection transistors receiving word selection signals at their control gate, to program a cell of a different word horizontally adjacent to the first word, the control gate of the selection transistor of the horizontally adjacent different word receives the selection signal of the first word.

10. The device of claim 4, wherein:

control gate electrodes of floating-gate transistors of cells of horizontally adjacent words in a memory array of the memory are connected to the same connection of word lines, drain electrodes of floating-gate transistors of cells of a given rank of vertically adjacent words in a memory array of the memory are connected to the same connection of bit lines, a bit line of a cell of a given rank of the first word being connected to a bit line of a cell of the same rank of the horizontally adjacent word of the memory, both lines being connected to two same common programming connections by means of a bias circuit, source electrodes of floating-gate transistors of the cells of a word are connected together to a source connection of the word, for words vertically adjacent to the first word, the source connections of these words are connected to a vertical connection of sources by means of vertical transistors for the selection of these vertically adjacent words, these selection transistors receiving word selection signals at their control gate, to program a cell of a different word horizontally adjacent to the first word, the control gate of the selection transistor of the horizontally adjacent different word receives the selection signal of the first word.

11. A method for the programming of Flash EPROM type memory cells of a first memory word of a memory organized in words, comprising the steps of:

providing a bias voltage to the electrodes of the floating-gate transistors of the first word, each floating-gate transistors serving as a storage element for a cell of the first word, so as to prompt the passage of saturation currents in the floating-gate transistors, the saturation currents being of such magnitude as to prompt the injection of charges into the respective floating gates of the floating-gate transistors; and successively programming the cells of the first word one at a time during successive programming cycles, wherein the first word includes at least three cells.

12. A method for the programming of Flash EPROM type memory cells of a first memory word of a memory organized in words, comprising the steps of:

providing a bias voltage to the electrodes of the floating-gate transistors of the first word, each floating-gate transistors serving as a storage element for a cell of the first word, so as to prompt the passage of saturation currents in the floating-gate transistors, the saturation currents being of such magnitude as to prompt the injection of charges into the respective floating gates of the floating-gate transistors; and programming the cells of the first word successively during different programming cycles, wherein the programming step is performed, during the same programming cycle, of a cell of a given rank of the first word and a different cell of the same rank, in at least one word that is different from the first word.

13. A method for the programming of Flash EPROM type memory cells of a first memory word of a memory organized in words, comprising the steps of:

providing a bias voltage to the electrodes of the floating-gate transistors of the first word, each floating-gate transistors serving as a storage element for a cell of the first word, so as to prompt the passage of saturation currents in the floating-gate transistors, the saturation currents being of such magnitude as to prompt the injection of charges into the respective floating gates of the floating-gate transistors;

programming the cells of the first word successively during different programming cycles;

organizing the memory array of the memory into two distinct pages, a first page and a second page, both consisting of groups of vertically adjacent words, the two pages together comprising horizontally interleaved words; and successively programming a first page and a second page of the memory array of the memory, the first page being programmed during a first instruction and the second page during a second instruction.

14. The method of claim 12, wherein:

the memory array of the memory is organized into two distinct pages, a first page and a second page, both consisting of groups of vertically adjacent words, the two pages together comprising horizontally interleaved words of this kind, successively programming a first page and a second page of the memory array of the memory, the first page being programmed during a first instruction and the second page during a second instruction.

15. The method of claim 11, wherein: the programming step is followed by refreshing the cells of a non-selected page.

16. The method of claim 12, wherein: the programming step is followed by refreshing the cells of a non-selected page.

17. The method of claim 13, wherein: the programming step is followed by refreshing the cells of a non-selected page.

18. The method of claim 14, wherein: the programming step is followed by refreshing the cells of a non-selected page.

19. A method for the programming of Flash EPROM type memory cells of a first memory word of a memory organized in words, comprising the steps of:

providing a bias voltage to the electrodes of the floating-gate transistors of the first word, each floating-gate transistors serving as a storage element for a cell of the first word, so as to prompt the passage of saturation currents in the floating-gate transistors, the saturation currents being of such magnitude as to prompt the injection of charges into the respective floating gates of the floating-gate transistors;

programming the cells of the first word successively during different programming cycles;

reprogramming all the memory cells of a selected page;

erasing all the memory cells of the selected page; and ascertaining that at least some memory cells of the selected page have undergone a depletion and, if this is the case:

making a correction, programming the selected cells, and refreshing the non-selected cells belonging to a non-selected page to be reprogrammed.

20. The method of the claim 12, further comprising:

reprogramming all the memory cells of a selected page;

erasing all the memory cells of the selected page;

ascertaining that at least some memory cells of the selected page have undergone a depletion and, if this is the case:

making a correction, programming the selected cells, refreshing the non-selected cells belonging to a non-selected page to be reprogrammed.

21. The method of the claim 13, further comprising:

reprogramming all the memory cells of a selected page;

erasing all the memory cells of the selected page;

ascertaining that at least some memory cells of the selected page have undergone a depletion and, if this is the case:

making a correction, programming the selected cells, refreshing the non-selected cells belonging to a non-selected page to be reprogrammed.

22. The method of claim 14, further comprising:

reprogramming all the memory cells of a selected page;

erasing all the memory cells of the selected page;

ascertaining that at least some memory cells of the selected page have undergone a depletion and, if this is the case:

making a correction, programming the selected cells, refreshing the non-selected cells belonging to a non-selected page to be reprogrammed.

23. A device for the programming Flash-EPROM type memory cells, wherein each memory cell is coupled to a bit line and to a word line, comprising:

connection means for organizing the memory cells into words, a plurality of floating-gate transistors acting as units of storage in the memory cells, wherein each floating-gate transistor comprises a drain electrode, a source electrode and a control gate electrode, the drain electrodes of the floating-gate transistors of the cells of a first word being connected to connections of differentiated bit lines of the first word, wherein the drain electrodes of the floating-gate transistors of each cell of each word vertically adjacent to the first word being connected to the bit line connections of the corresponding cell of the first word, wherein a bit line of a memory cell of a given rank of the first word and of at least one bit line of a memory cell of the same rank in a word horizontally adjacent to the first word are connected together to two common programming connections by means of bias circuits, and wherein each bias circuit comprises two bias voltage inputs and one bias voltage output.

24. A device for the programming of Flash-EPROM type memory cells comprising:

a plurality of floating-gate transistors acting as units of storage in the cells;

connection means for organizing the memory cells into words; and bit lines, carrying the data for memory cells, and wherein:

the drain electrodes of the floating-gate transistors of the cells of a first word are connected to different bit lines, and the bit lines connected to the cells of the first word are also connected to the drain electrodes of the floating-gate transistors of each cell of similar rank in each word vertically aligned with the first word, and a bit line connected to a cell of the first word and a bit line connected to a cell in a word which is horizontally aligned with the first word are each coupled to the same programming connections, wherein programming connections are the control lines used to activate or inhibit the programming of the memory cells.

25. The device of claim 24 further comprising:

a plurality of bias circuits, the plurality of bias circuits comprising:

a first bias circuit for placing the data on the bit line that is coupled to the programming connections, and a second bias circuit disposed between the programming connections and cell of the first word, and a third bias circuit disposed between the programming connections and the cell of horizontally aligned word, such that both cells can be programmed at the same time.

26. The device of claim 24 further comprising a bias circuit and a multiplexer, wherein a bias circuit is used to put the data on the bit line that is coupled to the programming connections, and wherein the bias circuit is disposed between the programming connections and the multiplexer, and the multiplexer is disposed between the bias circuit and the two bit lines, and wherein the multiplexer comprises two outputs, wherein the first output it coupled to the bit line that is coupled to the cell of the first word, and wherein the second output is coupled to the bit line that is coupled to the cell of the horizontally aligned word, such that only one of the two memory cells can be programmed at a time.

* * * * *